United States Patent [19]

Luchaco et al.

[11] Patent Number: 4,663,570
[45] Date of Patent: May 5, 1987

[54] HIGH FREQUENCY GAS DISCHARGE LAMP DIMMING BALLAST

[75] Inventors: David G. Luchaco, Macungie; Dennis Capewell, Coopersburg, both of Pa.

[73] Assignee: Lutron Electronics Co., Inc., Coopersburg, Pa.

[21] Appl. No.: 642,072

[22] Filed: Aug. 17, 1984

[51] Int. Cl.$^4$ .................. H05B 37/02; H05B 39/04; H05B 41/36

[52] U.S. Cl. .................. 315/219; 315/DIG. 4; 315/307; 315/159; 315/274; 315/279

[58] Field of Search .................. 315/307, 308, DIG. 4, 315/DIG. 7, 219, 159, 210, 220, 223, 274, 277, 279

[56] References Cited

U.S. PATENT DOCUMENTS

| | | | |
|---|---|---|---|
| 3,906,302 | 9/1975 | Wijsboom | 315/298 |
| 3,913,002 | 10/1975 | Steigerwald et al. | 315/224 |
| 3,969,652 | 7/1976 | Herzog | 315/308 |
| 4,132,925 | 1/1979 | Schmutzer et al. | 315/307 |
| 4,197,485 | 4/1980 | Nuver | 315/DIG. 4 X |
| 4,228,382 | 10/1980 | Virtanen | 315/219 |
| 4,253,046 | 2/1981 | Gerhard et al. | 315/307 |
| 4,358,717 | 11/1982 | Elliott | 315/DIG. 7 X |
| 4,385,262 | 5/1983 | Cambier et al. | 315/DIG. 4 |
| 4,395,660 | 7/1983 | Waskiewicz | 315/DIG. 4 X |
| 4,513,226 | 4/1985 | Josephson | 315/219 |

FOREIGN PATENT DOCUMENTS

| | | |
|---|---|---|
| 83/1313 | 6/1982 | PCT Int'l Appl. . |
| 2047486 | 4/1979 | United Kingdom . |
| 2030388 | 9/1979 | United Kingdom . |
| 2053594 | 7/1980 | United Kingdom . |
| 2095947 | 3/1982 | United Kingdom . |
| 1570927 | 5/1982 | United Kingdom . |
| 2120870 | 5/1982 | United Kingdom . |

Primary Examiner—Saxfield Chatmon
Attorney, Agent, or Firm—Ostrolenk, Faber, Gerb & Soffen

[57] ABSTRACT

A high frequency gas discharge lamp dimming ballast with good line power factor is disclosed. The unit is controlled by a current sensing loop which senses control switch current rather than lamp current and employs simple circuitry with sufficiently rapid control response necessary to maintain high line power factor and stable lamp operating characteristics over a very wide range of light output. An isolated output transformer provides protection against most common miswire conditions and accurately regulates lamp energy over a wide range of input and lamp arc voltage conditions. A pulse width modulated control input provides an isolated control input for easier wiring and reduces the susceptibility of the control to noise interference.

27 Claims, 6 Drawing Figures

HIGH FREQUENCY GAS DISCHARGE LAMP DIMMING BALLAST

BACKGROUND OF THE INVENTION

This invention relates to electronic ballasts for gas discharge lamp loads and more particularly to a ballast which permits lamp dimming, has a high power factor and is inexpensive.

Electronic ballasting circuits for fluorescent and similar gas discharge lamps are well known. Most electronic ballasts operate lamps at a fixed output level generally similar to the level which may be obtained from the lamp when operated from normal line frequency ballast circuits. The advantage in such application is obtained from the higher lamp efficiency at frequencies significantly higher than normal power frequencies of 50 or 60 Hz. High frequency operation can therefore provide equal light output with less power input to the lamp than is possible at line frequency. Alternatively, it is possible to obtain greater light output with the same electrical power input. If suitably low losses can be achieved in the high frequency ballast circuit, significant energy savings can result, particularly in the case of fluorescent lamps where the reduced system energy can result in system energy savings of greater than 20%.

Electronic ballasts which also permit dimming or control of gas discharge lamp output, are also known. The ability to control lamp output, coupled with the inherently more efficient lamp operation possible at high frequencies, can provide very significant energy savings when applied with suitable automatic controls. The savings possible with such dimmable high frequency gas discharge lamp ballasts can easily exceed 50% compared to uncontrolled line frequency ballasted systems.

Energy savings of this magnitude make such systems very desirable, yet they still have not gone into significant commercial use as compared to the number of lamps that continue to use uncontrolled line frequency ballasts. The reasons for this include: cost, susceptibility to damage due to miswire errors or accidental turn on of control devices, complex magnetic structures, poor power factor and limited control range.

High cost is a significant reason which has inhibited the introduction of electonic dimming ballasts. Line frequency ballasts have been manufactured for nearly 50 years and are highly optimized from a cost standpoint. Further, fewer individual components are needed in line frequency ballasts compared to existing frequency ballasts. Therefore, the high frequency electronic ballast has been inherently more costly than the line frequency ballast.

The large number of components and their susceptibility to damage reduces the reliability of electronic ballasts. Line frequency ballasts are better able to withstand extraordinary stresses which may be applied, particularly if a miswire condition occurs during installation. While a line frequency ballast can withstand a shorted output for many minutes, electronic ballasts usually fail immediately under the same conditions. This not only reduces system reliability, but also makes it difficult to meet safety requirements, such as those specified by Underwriters Laboratories.

Many prior art ballasts use two or more power semiconductor devices in their inverter circuits. Since these devices often dissipate significant amounts of power, they run at elevated temperatures, which substantially reduces their reliability. Also, these devices are relatively costly, both to purchase and to mount in the unit. It is obviously desirable to minimize the number of such devices to obtain maximum reliability and lower costs. Often, the use of two such devices introduces the possibility of instantaneous catastrophic failure modes if, for example, both devices were to conduct current simultaneously, instead of alternately, as is usually intended. Since it is quite possible for electronic noise, or other unanticipated events, to momentarily initiate simultaneous conduction, this represents a further reliability risk in circuits using multiple power devices.

Another common shortcoming of prior art electronic ballasts is the use of many and/or complex magnetic structures. These are needed to improve deficiencies such as poor power factor, or to reduce the total number of electronic components required. While these results are desirable, the introduction of complex magnetic components reduces the manufacturability of the unit. Although the components themselves are smaller at high frequencies, their small size requires greater precision in manufacturing. The high frequencies at which they are used often require the use of special materials and core shapes, all of which make the unit more difficult to manufacture and therefore more expensive.

An additional common shortcoming of prior art electronic ballasts is poor power factor. This is due to the use of a heavy filtered full wave bridge power supply using a large electrolytic filter capacitor to provide a d-c voltage to the high frequency inverter found in all such ballasts. Heavily filtered supplies of this type draw a relatively large capacitive current from the power line, so that in many cases, a branch circuit which can supply 90 fluorescent lamps using line frequency ballasts, may be limited to less than 70 lamps using high frequency ballasts. The filter capacitors are also physically large compared to the other components and carry relatively high ripple currents. Therefore they increase the size and cost of the unit. Also, because of their electrolytic construction and significant power dissipation, they reduce the overall reliability of the system.

In the case of electronic dimming ballasts, additional input wires are needed to provide control information to the ballast and this complicates installation. These control leads are invariably referenced to the a-c line power input circuit. Many lighting systems are connected to three-phase a-c circuits, and it is common practice to supply adjacent fixtures from dissimilar phases to reduce the perceived flicker level in the discharge lamp output. The control wires which are galvanically referenced to the a-c power input are commonly connected in parallel to cause all ballasts to follow the same control voltage. All ballasts having such parallel control leads must then be operated from the same a-c voltage phase to avoid a phase-to-phase short circuit of the a-c source through the ballasts and their parallel control leads, which would cause the destruction of the ballasts. Avoiding this condition results in additional complications in installing wiring for such a lighting system, whereby minor wiring mistakes can result in widespread destruction of ballast units.

Also, in a dimming ballast, it is common practice to use a variable voltage level on the control inputs to provide the ballast with information regarding the desired level of light output. Since the ballast is a high frequency power supply, it can easily induce noise components into the control leads which disturb the operation of the lamps. This is particularly true if the control voltage is near zero volts when the lamps are at their lowest output setting. Under these conditions, the lamps are most sensitive to disturbances and any noise picked up on the control leads is most significant when compared to the relatively low control voltage at low light output levels.

Finally, most prior art dimming ballasts are limited in their control range and vary the light output of their lamps over a ratio of only 10 to 1, or even less. While this is adequate for energy management applications, it is sufficient for most kinesthetic or architectural dimming applications where a range of 100 to 1 is more commonly required. The additional flexibility provided by such a wide range control capability significantly increases the functional and marketable value of the high frequency unit compared to the standard uncontrolled line frequency ballast. Thus, since the high frequency ballast is inherently more costly, it is necessary to offer significant performance advantages to justify the unavoidably higher unit cost.

Several prior art references demonstrate many of the above points. U.S. Pat. No. 4,414,491 dated Nov. 8, 1983 discloses a non-dimming electronic ballast with relatively few components, but using two power semiconductor devices, a large filter capacitor and a relatively complex magnetic structure. Further, the magnetic structure shown is built of relatively expensive material.

A similar device is disclosed in U.S. Pat. No. 4,392,087 dated July 5, 1983 which uses two power semiconductor devices, complex magnetics and a large filter capacitor. Dimming is obtained by voltage reduction or pulse width modulation of the power devices, but the dimming range cannot exceed a 10 to 1 ratio with standard fluorescent lamps.

U.S. Pat. No. 4,358,716 dated Nov. 9, 1982 discloses an electronic ballast which can be dimmed by duty cycle control of high frequency pulse bursts for gas discharge lamps. This unit also includes two power devices and a large filter capacitor previously discussed.

The circuit shown in U.S. Pat. No. 4,392,086 dated July 5, 1983 improves power factor by removing the large capacitor to a small auxiliary supply which is used to keep the lamp arc struck during periods of 60 Hz line power cycle when the voltage is too low for proper lamp operation. However, two power devices and several magnetic structures are used and the dimming control range is relatively limited.

U.S. Pat. No. 4,277,728 dated July 7, 1981 also uses a relatively small d-c filter capacitor in combination with an active switching regulator to improve power factor. Three semiconductor power devices are used and a large number of complex magnetic elements is required to implement the circuit. A control range of only 10 to 1 is available.

In all of the preceding prior art patents which teach dimming, the dimming control leads would be galvanically referenced to the a-c power leads. This gives rise to the aforementioned wiring complications and the possibility of catastrophic miswire conditions.

U.S. Pat. Nos. 3,619,716 and 3,731,142, assigned to Lutron electronics Co., Inc. and U.S. Pat. No. 3,265,930 disclose a single power switching device in an electronic ballast. In particular, U.S. Pat. Nos. 3,619,716 and 3,731,142 teach control of gas discharge lamps by use of a single power switching device and a pulse forming network connected across the lamp. By keeping the "on" time of the power device short compared to the lamp arc time constant, lamp current runaway is avoided and the pulse forming network stored energy is allowed to circulate through the arc when the power switch is in the "off" state. The use of a single switch eliminates the cost and reliability problems described above, and the stored energy in the pulse forming network allows wide range dimming control. These principles were applied commercially in 1974 in an electronic dimming ballast sold by Lutron Electronics Co., Inc. under the trademark "Hi-Lume".

The Hi-Lume ballast circuit uses a sample output inductor as a pulse forming network, and a current sensing resistor is placed in series with the lamp arc current. The control circuitry rectifies and filters the voltage dropped across the current sensing resistor, which is proportional to lamp arc current. This value is compared to the dimming control voltage input, and the duty cycle of the single power switching device (a switching transistor) is adjusted until the lamp arc current is stable at the level commanded by the magnitude of the dimming control voltage. A large filter capacitor supplies smooth d-c voltage to the inverter portion of the circuit. The use of an accurate servo feedback loop which directly monitors the lamp arc current results in very stable dimming capability for the Hi-Lume circuit over a range in excess of 100 to 1 light output ratio, with no striations or flicker effects visible in the lamps.

Today, 10 years after its introduction, the Hi-Lume system is still the best quality fluorescent dimming control commercially available. However, to achieve this level of performance, some compromises were required. Thus, the large filter capacitor causes a relatively poor power factor and branch circuit lamp capacities must be derated. The control circuitry is relatively complex in order to stabilize the internal servo loop and results in high cost, even though a single power device and one relatively simple magnetic structure is required. Inherent reliability is very good due to the single power device structure, but miswiring the lamp leads can result in failures since they are directly connected to the power switch and control circuitry. Also, the dimming control leads are referenced directly to the a-c line through the bridge rectifier. This means increased costs since isolation amplifier circuitry and current surge reduction circuitry must be used in conjunction with any significant numbers of these devices.

BRIEF DESCRIPTION OF THE INVENTION

The present invention retains the simple basic structure and excellent dimming performance of the Hi-Lume product, while improving significantly such areas as control circuit simplicity, power factor, miswire protection, control circuit isolation and noise immunity. Thus, the circuit of the present invention still uses only one power switch and a single magnetic structure. However, the current sense resistor is placed in series with the power switch device, rather than the lamp. Also, the lamp is galvanically isolated from the switching circuitry. These precautions practically eliminate the possibility of circuit failure due to miswiring of the lamp leads, since such errors can no longer disable the current sensing circuitry or cause direct shorts to ground from the a-c line.

Also, the filter capacitor may now have a relatively small value, which serves to provide a high frequency short at the power supply terminals, but does not significantly affect the 60 Hz line power factor at full lamp output. When the inverter is delivering full lamp power, the current drain serves to discharge the filter capacitor rapidly and the d-c bus voltage has a typical unfiltered full wave rectified voltage waveform. This provides excellent line power factor at full lamp output. At very low lamp output levels, the capacitor voltage is smoothed, and does not follow the line voltage waveform, so power factor is reduced. However, at low output levels, a low power factor has no significant disadvantages and the smoother d-c waveform serves to improve lamp stability and dimming performance at the very low end of the range.

The control circuitry shown above also operates substantially differently from prior art devices. In U.S. Pat. No. 3,265,930 referred to above, the lamp arc current is monitored and directly controls the conduction state of the series power switching device. The device is turned on and remains on until the arc current reaches a predetermined upper limit, and the power device is opened and left open until the arc current falls below a second limit. In the present invention, lamp arc current is not measured but power switch current is used instead, to avoid the miswire problems already described. Further, in the present invention the power switch remains on until an upper current limit is exceeded, but turns off and remains off until an internal oscillator signals it to turn back on to start another cycle. This fixes the operating frequency of the circuit to a known value, instead of making it a function of lamp parameters, as in U.S. Pat. No. 3,265,930. This makes the lamp light output less dependent on variations in line voltage and lamp arc voltage, and prevents operation in the audible frequency range, where an annoying "singing" noise may be noticed by users of the area illuminated.

The circuit of U.S. Pat. No. 3,265,930 also turns off the power switch at a fixed predetermined value of current. The present invention makes this limit a function of the instantaneous line voltage. This type of control results in a nearly sinusoidal line current waveshape which is in phase with the line voltage. Therefore, the line power factor, as mentioned above, is very good. This rapid variation in control current level to follow the 120 Hz fullwave envelope is not feasible in the present Hi-Lume device, since filtered current feedback signals used there respond too slowly to follow a line frequency correction function such as this. The rapid response of the present invention current loop also provides an inherently stable control loop and greatly reduces the complexity of the control circuitry. Finally, the rapid response prevents the power device from seeing current surges above its normal design levels, even under unusual operating conditions such as miswires.

The circuit of the present invention also employs a dielectrically isolated coupling device between the dimming control leads and the control circuitry. Instead of a variable d-c voltage input, the coupler is supplied with a variable duty cycle square wave input. As mentioned earlier, this allows easier wiring layout, since one no longer needs to be concerned with assuring that units with parallel control leads must always be fed from the same a-c phase line. Noise immunity is also improved.

The invention also provides a novel method for causing multiple lamps operated from a single ballast circuit to share equally the arc current supplied by the ballast. Since gas discharge lamps have a negative resistance arc voltage/current characteristic, operating such lamps in parallel always results in one lamp conducting all the current and the other going completely out. There are two known approaches to solving this problem. The most common is to operate lamps in series. While this works well with several lamps at 60 Hz and with two lamps at high frequencies, the higher voltages required can cause problems in meeting U.L. Safety Standards. Furthermore, in a wide range dimming control, capacitive leakage currents become very significant at less than 1% of full rated output, and series operation of three or more lamps results in serious unbalance in lamp output at a low light levels.

A second known approach to this problem is to operate the lamps in parallel, using small but expensive current balancing transformers to keep one lamp from stealing all the available arc current. In a two lamp unit only one balancer is required, but a four lamp pack requires three balancers and the expense and complexity are quite significant.

The use of an isolated output transformer in the present invention along with the control of the power switch current, enables a new method of forcing lamp current sharing in multiple lamp units. As was already mentioned, two series lamps work well, but more than two creates problems. The present invention uses a separate energy storage inductor and two output transformers with their primaries connected in series. The load on each transformer is one or more, preferably two, series connected lamps. This achieves the effect of four series lamps with inherent current sharing properties, but the voltages at the transformer secondaries are no higher than in the two lamp case. In this scheme, there are three separate magnetic elements. When a single output transformer is used, the storage inductor may easily be incorporated as part of the transformer structure itself, so that only one magnetic element is required. Similarly, the three element structure described above may be integrated into a single magnetic element. Although such an element is relatively complex, the ability to share all the rest of the circuitry among four lamps instead of two is cost effective for the overall unit.

As pointed out above, an important feature of the invention is the use of a single power switch. Note, however, that the single power switch can be implemented in a novel manner by a high voltage bipolar device and a low voltage power MOSFET device connected in cascode circuit relationship. The high voltage bipolar device provides the necessary high voltage characteristics for the switch, while the low voltage power MOSFET provides extremely high speed operation. In the preferred embodiment of the invention, a NPN bipolar device is connected in series with the drain and source electrodes of a low voltage power MOSFET. Included in the connection between the bipolar transistor emitter and the drain of the power MOSFET, is the primary winding of a current transformer. The secondary winding is then connected between the base of the bipolar device and the drain of the MOSFET. The base of the bipolar device is also connected to a small zener diode which has its other terminal connected to the power MOSFET source terminal. This novel control and switching circuit, for what is, in effect, a single power switching device, provides high voltage, high speed turn off and is extremely easy to drive. The circuit arrangement also prevents second breakdown of the bipolar transistor.

DETAILED DESCRIPTION OF THE DRAWINGS

Figure 1:
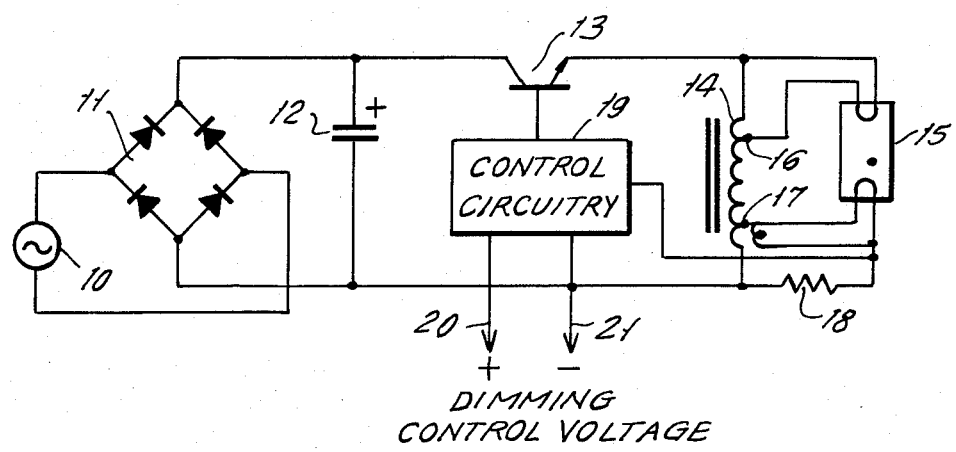
FIG. 1 is a circuit diagram of a prior art Hi-Lume dimming device.

Referring first to the circuit of FIG. 1, there is shown therein a prior art Hi-Lume electronic ballast which is capable of a wide degree of regulation and which has been manufactured and sold by the assignee of the present invention for many years. The circuit is operated from an a-c source 10, which can be a conventional, commercially available source of voltage, i.e. 110, 220 or 277 volts at 50 or 60 Hz. The output of the source 10 is applied to the conventional single phase full wave bridge connected rectifier 11, which delivers a rectified output across a relatively large filter capacitor 12, which is an electrolytic capacitor. The positive terminal of bridge 11 is also connected to the collector of the schematically illustrated bipolar switching transistor 13, which in turn is connected to the inductive ballast 14 and gas discharge lamp 15, which can be any desired gas discharge lamp, i.e. a fluorescent lamp. Taps 16 and 17 on the ballast 14 provide a source of filament voltage for the filaments of the gas discharge lamp 15.

A current sensing resistor 18 is connected in series with the lamp 15 and produces an output voltage which is applied to control circuitry 19. Control circuitry 19 can be of any desired type and receives an input dimming control voltage on leads 20 and 21 which control, in combination with the current sensing resistor 18, the control signal applied to the base of transistor 13 and tends to regulate the output to keep the current through current sensing resistor 18 to a value set by the dimming voltage control signal at lines 20 and 21.

The circuit of FIG. 1 is a relatively simple structure having excellent dimming performance. The circuit uses the simple output inductor 14 as a pulse forming network and the current sensing resistor 18 is in series with the lamp arc current. The control circuitry 19 is arranged to rectify and filter the voltage across resistor 18, which is proportional to lamp arc current. This monitored voltage value is then compared to the dimming control voltage input and the duty cycle of the switching transistor 13 is then adjusted until the lamp arc current is stable at the level commanded by the magnitude of the dimming voltage control applied to leads 20 and 21. The large filter capacitor 12 simply supplies smooth d-c voltage to the inverter portion of the circuit.

The circuit of FIG. 1 employs an accurate servo feedback loop, which results in very stable dimming capability. This, however, is at the expense of a large filter capacitor which reduces the power factor of the circuit. Moreover, the control circuitry 19 is relatively complex in order to provide a stabilized internal servo loop and is relatively expensive. Thus, the entire circuit is relatively expensive, even though only a single power switching device and a relatively simple magnetic structure is used. Miswiring of the lamp leads for the lamp 15 can also result in failures since the leads are directly connected to the power switch 13 and control circuitry 19. Also, the dimming control leads are necessarily referenced directly to the a-c line through the bridge connected rectifier 11 (this connection is not shown). Therefore, there are increased costs since isolation amplifier circuitry and current surge reduction circuitry must be used in conjunction with any significant numbers of the circuits of FIG. 1.

Figure 2:
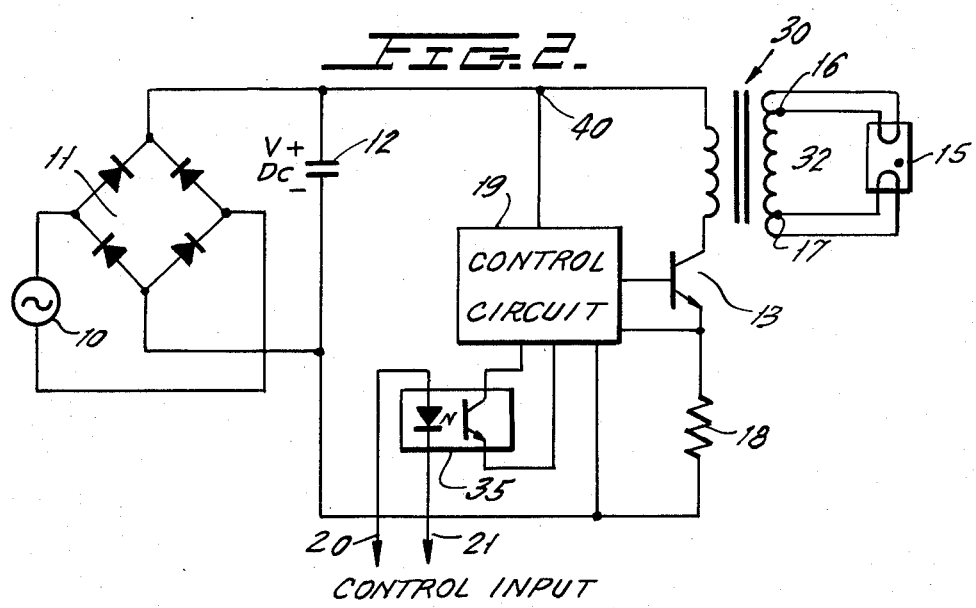
FIG. 2 is a circuit diagram of the novel circuit of the present invention.

FIG. 2 is a circuit diagram of the present invention which retains the simple basic structure and excellent dimming performance of the prior art circuit of FIG. 1, capacitor 12 is about 300 microfarads, whereas in the circuit of FIG. 2 it is about 3 microfarads. Depending on the size of the lamp load, prior art circuits have used capacitances of as low as 35 microfarads, for low lamp loads. However, the invention contemplates the use of capacitance values less than about 30 microfarads, even for high lamp loads.

As further shown in FIG. 2, the ballast transformer consists of the two winding transformer 30 having a primary winding 31 which is dielectrically isolated from and magnetically coupled to the secondary winding 32. The secondary winding 32 contains the taps 16 and 17 for operating the filament of the gas discharge lamp 15.

The switching transistor 13 in FIG. 2 is then connected in series with winding 31 and in series with the current sensing resistor 18. Significantly, the current sensing resistor 18 of FIG. 2 is connected in series with the transistor 13, rather than in series with the actual lamp current of lamp 15 as in FIG. 1.

A further signficant change in the circuit of FIG. 1 is the employment of a standard optoisolator 35 for coupling the input signal at the control input lines 20 and 21 to the control circuitry 19. The optoisolator 35 consists of any conventional internal arrangement, such as a light emitting diode which is optically coupled to, but dielectrically insulated from, a light sensitive transistor, which are the schematically illustrated components in FIG. 2.

The arrangement shown for the lamp 15, which is operated from an isolating transformer 30, permits galvanic isolation of the lamp from the switching circuitry. This precaution practically eliminates the possibility of circuit failure due to miswiring of the lamp leads since such errors can no longer disable the current sensing circuitry, or cause direct shorts to ground from the a-c line.

Figure 3:
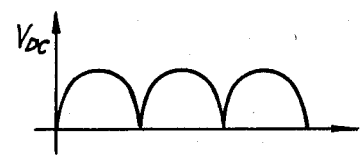
FIG. 3 shows the output voltage on the filter capacitor of FIG. 2 when the inverter is delivering full lamp output.
Figure 4:
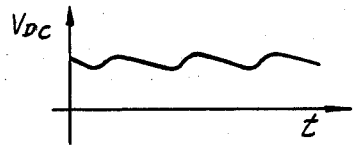
FIG. 4 shows the voltage on the filter capacitor of FIG. 2 at reduced lamp power condition.

The filter capacitor 12 is made much smaller in the circuit of FIG. 2 and acts as a high frequency short at the power supply terminals of the a-c line 10. However, the capacitor does not significantly affect the line power factor at full lamp output. Thus, when the inverter is delivering full lamp power, the current drain serves to discharge the capacitor 12 rapidly so that the d-c bus voltage has the typical unfiltered full wave rectified voltage waveform shown in FIG. 3. Thus, there is an excellent line power factor at full lamp output. When, however, the lamp output current is relatively low, the capacitor voltage across capacitor 12 does not follow the line voltage waveform but appears, for example, as shown in FIG. 4. Therefore, at low output levels, power factor is reduced. This, however, has no significant disadvantage at the low current level, and the smoother d-c waveform improves lamp stability and dimming performance at the low end of the dimming range.

As pointed out above, it is also significant in the novel circuit of FIG. 2 that lamp arc current is not measured by the current sensing resistor 18, as in the case of FIG. 1, but instead the power switch current is measured. This connection removes the current sensing resistor 18 from the lamp terminals and thus helps avoid miswire problems. Moreover, in the use of the circuit of the invention, the power switching device 13 remains on until an upper current limit is exceeded and then turns off and remains off until an internal oscillator (not shown) within the control circuitry 19 turns it back on to start a new cycle. This then fixes the operating frequency of the circuit to a known value, rather than making it a function of lamp parameter, as in the prior art. This in turn makes the lamp light output less dependent on variations in line voltage and lamp arc voltage, and prevents operation in an audio frequency range where an annoying "hum" may be produced.

The circuit of FIG. 2 also provides a control current loop which is inherently stable, provides rapid response and greatly reduces the complexity of the control circuitry. Such rapid response prevents the power switching transistor 13 from exposure to current surges which are above its normal design levels, even under unusual operating conditions such as those caused by miswiring.

The use of the optoisolator 35 permits a more direct connection from the dimming control leads to the control circuitry 19. Thus, in the past a variable d-c voltage input has been used. The optoisolator 35 permits the use of a variable duty cycle square wave input to the control leads 20 and 21 for more direct control of the system. This, again, allows easier wiring, since multiple ballasts with paralleled control leads no longer need be fed from the same a-c phase line. The optocoupler also provides improved noise immunity for the system.

Figure 5:
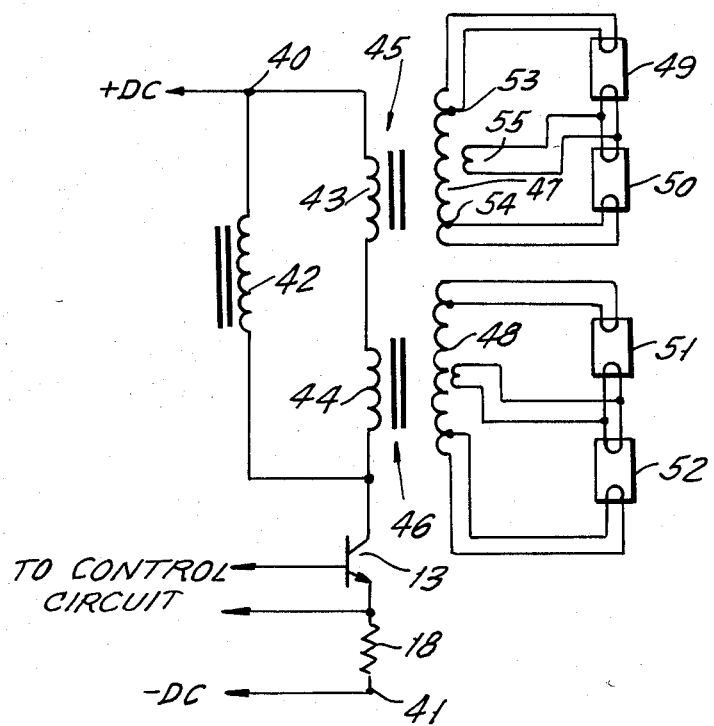
FIG. 5 is a circuit diagram of a novel isolated output transformer arrangement employing plural lamps which are forced to share current equally.

The present invention also provides a novel arrangement for operating multiple lamps from a single ballast circuit, and to force the multiple lamps to equally share the arc current provided by the ballast. This novel current dividing circuit is shown in FIG. 5, wherein components similar to those of FIG. 2 have been given similar identifying numerals. Thus, in FIG. 5 the nodes 40 and 41 correspond to the nodes 40 and 41 in FIG. 2. A single ballast inductor 42 is connected in parallel with primary windings 43 and 44 of transformers 45 and 46, which have respective secondary windings 47 and 48. The turns ratio of windings 43 and 44 to secondary windings 47 and 48 may be 1:2. Each of windings 47 and 48 is connected to drive two series connected lamps 49-50 and 51-52, respectively. Winding taps 53 and 54 are connected to one filament of each of lamps 49 and 50, and a central winding tap 55 is connected to the other filaments of each of lamps 49 and 50 as shown in FIG. 5. A similar arrangement is provided for transformer 46 and lamps 51 and 52.

It will be observed that any desired number of transformers 45 and 46 could have been used to produce any desired number of lamps in the particular bank described in FIG. 5. Each set of lamps consists of only two lamps in series, thus limiting the maximum voltage necessary in the ballast. This novel method of balancing the current between a plurality of lamps is made possible through the use of the isolated output transformer, and with the remote disposition of the current sensing resistor. Inductor 42 of FIG. 5 acts as a separate energy storage inductor, while the output transformers 45 and 46 carry the same primary current, thus insuring equal division of current between the lamps 49 through 52.

The scheme shown in FIG. 5 requires three separate magnetic elements. Thus, the ballast becomes relatively complex, but the ability to force sharing of current between four lamps, instead of two, is very cost effective for the overall unit.

Another feature of the present invention involves a novel implementation for the single power switching transistor 13 of the foregoing Figures along with a novel control mode therefor. More specifically, and as disclosed in FIG. 6, the single, high voltage switching device 13 can be formed of a high voltage transistor 70, which is connected in series with a low voltage power MOSFET 71. These components are connected in the well-known cascode circuit arrangement. The transistor 70 may comprise a PNP or NPN bipolar transistor and may be a type MJE 13007A (Motorola) device and the MOSFET 71 may be a BUZ 710 (Siemens) device. The bipolar transistor 70 produces the necessary high voltage withstandability required for the switch 13, while the MOSFET 71 provides the desirable high speed operation for the device.

Figure 6:
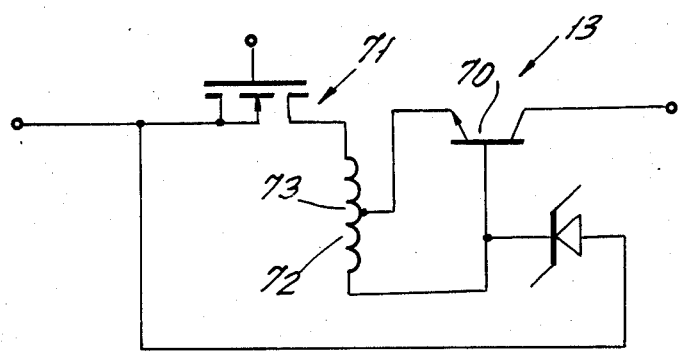
FIG. 6 is a circuit diagram of an embodiment of the novel single power switch and electrical drive circuitry therefor.

A novel control circuit is also employed in FIG. 6, which insures cooperation in the operation of transistors 70 and 71, while avoiding second breakdown of the bipolar transistor 70. Thus, a current transformer 72 is provided, which has 24 turns on a ferrite core. A four turn tap section 73 is connected in series between the emitter of transistor 70 and the drain of transistor 71 as shown. The remainder of the winding is then connected to the base of transistor 70. A zener diode is then connected between the base of transistor 70 and the source of transistor 71 as shown. The control circuit 19 of FIG. 2, for example, is then connected to the gate of MOSFET 71 in order to switch on and off the switching structure 13.

In operation, assuming that the switch 13 is in conduction and a signal is produced to turn off the switch 13, the MOSFET 71 shuts off extremely rapidly, thereby causing a sharp drop in the emitter current of the bipolar transistor 70. The bipolar collector current which still flows during turn off will pass through the zener diode and to the source lead of the MOSFET to fully turn off bipolar transistor 70. Thus, high speed turn off can be obtained while the MOSFET is still well protected.

Note that during conduction of the switch 13, emitter current passes through the four turn section 73 of transformer 72. Consequently, transformer 72 acts as a current transformer and forces one-fifth of the full emitter current into the base thereby generating the base drive for transistor 70. The ferrite core will be designed so that it will not saturate during this operation.

As a result, the above described circuit of FIG. 6 acts to provide high speed turn off and is very easy to drive. Moreover, second breakdown of the bipolar transistor 70 is prevented to make the bipolar transistor more rugged.

Although the present invention has been described in connection with preferred embodiments thereof, many variations and modifications will now become apparent to those skilled in the art. It is preferred therefore, that the present invention be limited not by the specific disclosure herein, but only by the appended claims.

What is claimed is:

1. An electronic ballast for a gas discharge lamp; said electronic ballast being dimmable over a large range; said ballast comprising: an a-c input circuit; a rectifier having a-c terminals connected to said a-c input circuit and having d-c output terminals; a filter capacitor connected across said d-c output terminals, said filter capacitor having a value less than about 30 microfarads; a transformer means having primary and secondary windings; a gas discharge lamp connected across the terminals of said secondary winding; a single semiconductor switching means having a control electrode and first and second power terminals; a current sensing means; a control circuit connected to said control electrode and operable to turn said switching means on and off at a controlled duty cycle rate; a dimming level set circuit connected to said control circuit to set said duty cycle to a value related to a given degree of dimming of said lamp; said current sensing means being connected to said control circuit and operable to adjust said duty cycle to a value which maintains the current through said current sensing means at a value related to that called for by said dimming level set circuit; said d-c output terminals, said primary winding, said single semiconductor switch means and said current sensing means being connected in closed series relation.

2. The electronic ballast of claim 1 wherein said secondary winding has heater tap sections connected to the heaters of the filaments of said gas discharge lamp.

3. The electronic ballast of claim 1 which includes a second transformer having primary and secondary windings; said primary windings of said transformer and of said second transformer connected in series in said closed series circuit; and inductor means connected in parallel with said series connected primary windings; and a second gas discharge lamp connected across the terminals of said secondary winding of said second transformer.

4. The electronic ballast of claim 1 wherein at least two series connected gas discharge lamps are connected across the terminals of each of said secondary windings.

5. The electronic ballast of claim 1 which further includes a dielectrically isolated coupling device for coupling said dimming level set circuit to said control circuit.

6. The electronic ballast of claim 1 wherein said single semiconductor switching means comprises a bipolar transistor.

7. An electronic ballast for a gas discharge lamp; said electronic ballast being dimmable over a large range; said ballast comprising: and a-c input circuit; a bridge connected rectifier having a-c terminals connected to said a-c input circuit and having d-c output terminals; a filter capacitor connected across said d-c output terminals, said filter capacitor having a value less than about 30 microfarads; an energy storage element having first and second terminals; a gas discharge lamp inductively coupled to said energy storage element; a single semiconductor switching means which comprises a high voltage bipolar transistor and a low voltage power FET connected in cascode relation; and having a control electrode and first and second power terminals; a current sensing means; a control circuit connected to said control electrode and operable to turn said switching means on and off at a controlled duty cycle rate; a dimming level set circuit connected to said control circuit to set said duty cycle to a value related to a given degree of dimming of said lamp; said current sensing means being connected to said control circuit and operable to adjust said duty cycle to a value which maintains the current through said current sensing means at a value related to that called for by said dimming level set circuit; said d-c output terminals, said first and second terminals of said energy storage element, said single semiconductor switch means and said current sensing means being connected in close series relation.

8. The electronic ballast of claim 7 which further includes a dielectrically isolated coupling device for coupling said dimming level set circuit to said control circuit.

9. The electronic ballast of claim 7 wherein said single semiconductor switching means comprises a transistor.

10. An electronic ballast for a gas discharge lamp; said ballast comprising: an a-c input circuit; a full wave bridge connected rectifier having a-c terminals connected to said a-c input circuit and having d-c output terminals; a filter capacitor connected across said d-c output terminals, said filter capacitor having a value less than about 30 microfarads; a transformer means having primary and secondary windings; a gas discharge lamp connected across the terminals of said secondary winding; a single semiconductor switching means having a control electrode and first and second power terminals; a current sensing means; a control circuit connected to said control electrode and operable to turn said switching means on and off at a controlled duty cycle rate; a current level set circuit connected to said control circuit to set said duty cycle to a value related to a given value of current in said lamp; said current sensing means being connected to said control circuit and operable to adjust said duty cycle to a value which maintains the current through said current sensing means at a value related to that called for by said current level set circuit; said d-c output terminals, said primary winding, said single semiconductor switch means and said current sensing means being connected in closed series relation.

11. The electronic ballast of claim 10 wherein said secondary winding has heater tap sections connected to the heaters of the filaments of said gas discharge lamp.

12. The electronic ballast of claim 10 which includes a second transformer having primary and secondary windings; said primary winding of said transformer and of said second transformer connected in series in said closed series circuit; and inductor means connected in parallel with said series connected primary windings; and a second gas discharge lamp connected across the terminals of said secondary winding of said secondary transformer.

13. The electronic ballast of claim 12 wherein at least two series connected gas discharge lamps are connected across the terminals of each of said secondary windings.

14. The electronic ballast of claim 10 which further includes a dielectrically isolated coupling device for coupling said current level set circuit to said control circuit.

15. The electronic ballast of claim 10 wherein said single semiconductor switching means comprises a transistor.

16. An electronic ballast for a gas discharge lamp; said ballast comprising: a bridge connected rectifier having a-c terminals connected to said a-c input circuit and having d-c output terminals; a filter capacitor connected across said d-c output terminals, said filter capacitor having a value less than about 30 microfarads; an energy storge element having first and second terminals; a gas discharge lamp inductively coupled to said energy storage element; a single semiconductor switching means having a control electrode and first and second power terminals; a current sensing means; a control circuit connected to said control electrode and operable to turn said switching means on and off at a controlled duty cycle rate; a current level set circuit connected to said control circuit to set said duty cycle to a value related to a given value of current in said lamp; said current sensing means being connected to said control circuit and operable to adjust said duty cycle to a value which maintains the current through said current sensing means at a value related to that called for by said current level set circuit; said d-c output terminals, said first and second terminals of said energy storage element, said single semiconductor switch means and said current sensing means being connected in closed series relation.

17. The electronic ballast of claim 16 which further includes a dielectrically isolated coupling device for coupling said current level set circuit to said control circuit.

18. The electronic ballast of claim 16 wherein said single semiconductor switching means comprises a transistor.

19. The electronic ballast of claim 10 comprising at least two series connected gas discharge lamps connected across the terminals of each of said secondary windings.

20. The electronic ballast of claim 5 wherein said dielectrically isolated coupling device comprises an optoisolator component.

21. The electronic ballast of claim 8 wherein said dielectrically isolated coupling device comprises an optoisolator component.

22. The electronic ballast of claim 14 wherein said dielectrically isolated coupling device comprises an optoisolator component.

23. The electronic ballast of claim 17 wherein said dielectrically isolated coupling device comprises an optoisolator component.

24. An electronic ballast for a gas discharge lamp; said electronic ballast being dimmable over a large range; said ballast comprising: an a-c input circuit; a recifier having a-c terminals connected to said a-c input circuit and having d-c output terminals; a filter capacitor connected across said d-c output terminals; a transformer means having primary and secondary windings; a gas discharge lamp connected across the terminals of said secondary winding; a single semiconductor switching means which comprises a high voltage bipolar transistor and a low voltage power MOSFET connected in cascode relation, said switching means having a control electrode and first and second power terminals; a current sensing means; a control circuit connected to said control electrode and operable to turn said switching means on and off at a controlled duty cycle rate; a dimming level set circuit connected to said control circuit to set said duty cycle to a value related to a given degree of dimming of said lamp; said current sensing means being connected to said control circuit and operable to adjust said duty cycle to a value which maintains the current through said current sensing means at a value related to that called for by said dimming level set circuit; said d-c output terminals, said primary winding, said single semiconductor switch means and said current sensing means being connected in closed series relation; said ballast further comprising current transformer means having a tap terminal means and end terminals; said end terminals connected to the base of said bipolar transistor and the drain of said MOSFET, respectively; said tap terminal connected to one of the emitter and collector of said bipolar transistor; the source of said MOSFET and one of the emitter and collector of said bipolar transistor which is not connected to said tap terminal being connected in said series circuit; and a zener diode connected between said base of said bipolar transistor and said source of said MOSFET.

25. An electronic ballast for a gas discharge lamp; said electronic ballast being dimmable over a large range; said ballast comprising: an a-c input circuit; a bridge connected rectifier having a-c terminals connected to said a-c input circuit and having d-c output terminals; a filter capacitor connected across said d-c output terminals; an energy storage element having first and second terminals; a gas discharge lamp inductively coupled to said energy storage element; a single semiconductor switching means which comprises a high voltage bipolar transistor and a low voltage power MOSFET connected in cascode relation, said switching means having a control electrode and first and second power terminals; a current sensing means; a control circuit connected to said control electrode and operable to turn said switching means on and off at a controlled duty cycle rate; a dimming level set circuit connected to said control circuit to set said duty cycle to a value related to a given degree of dimming of said lamp; said current sensing means being connected to said control circuit and operable to adjust said duty cycle to a value which maintains the current through said current sensing means at a value related to that called for by said dimming level set circuit; said d-c output terminals, said first and second terminals of said energy storage element, said single semiconductor switch means and said current sensing means being connected in closed series relation, said ballast further including current transformer means having a tap terminal means and end terminals; said end terminals connected to the base of said bipolar transistor and the drain of said MOSFET, respectively; said tap terminal connected to the emitter of said bipolar transistor; the source of said MOSFET and the collector of said bipolar transistor connected in said series circuit; and a zener diode connected between said base of said bipolar transistor and said source of said MOSFET.

26. An electronic ballast for a gas discharge lamp; said ballast comprising: an a-c input circuit; a full wave bridge connected rectifier having a-c terminals connected to said a-c input circuit and having d-c output terminals; a filter capacitor connected across said d-c output terminals; a transformer means having primary and secondary windings; a gas discharge lamp connected across the terminals of said secondary winding; a single semiconductor switching means which comprises a high voltage bipolar transistor and a low voltage power MOSFET connected in cascode relation, said switching means having a control electrode and first and second power terminals; a current sensing means; a control circuit connected to said control electrode and operable to turn said switching means on and off at a controlled duty cycle rate; a current level set circuit connected to said control circuit to set said duty cycle to a value related to a given value of current in said lamp; said current sensing means being connected to said control circuit and operable to adjust said duty cycle to a value which maintains the current through said current sensing means at a value related to that called for by said current level set circuit; said d-c output terminals, said primary winding, said single semiconductor switch means and said current sensing means being connected in closed series relation; said ballast further comprising current transformer means having a tap terminal means and end terminals; said end terminals connected to the base of said bipolar transistor and the drain of said MOSFET, respectively; said tap terminal connected to the emitter of said bipolar transistor; the source of said MOSFET and the collector of said bipolar transistor connected in said series circuit; and a zener diode connected between said base of said bipolar transistor and said source of said MOSFET.

27. An electronic ballast for a gas discharge lamp; said ballast comprising: a bridge connected rectifier having a-c terminals connected to said a-c input circuit and having d-c output terminals; a filter capacitor connected across said d-c output terminals; an energy storage element having first and second terminals; a gas discharge lamp inductively coupled to said energy storage element; a single semiconductor switching means which comprises a high voltage bipolar transistor and a low voltage power MOSFET connected in cascode relation, said switching means having a control electrode and first and second power terminals; a current sensing means; a control circuit connected to said control electrode and operable to turn said switching means on and off at a controlled duty cycle rate; a current level set circuit connected to said control circuit to set said duty cycle to a value related to a given value of current in said lamp; said current sensing means being connected to said control circuit and operable to adjust said duty cycle to a value which maintains the current through said current sensing means at a value related to that called for by said current level set circuit; said d-c output terminals, said first and second terminals of said energy storage element, said single semiconductor switch means and said current sensing means being connected in closing series relation; said ballast further comprising current transformer means having a tap terminal means and end terminals; said end terminals connected to the base of said bipolar transistor and the drain of said MOSFET, respectively; said tap terminal connected to the emitter of said bipolar transistor; the source of said MOSFET and the collector of said bipolar transistor connected in said series circuit; and a zener diode connected between said base of said bipolar transistor and said source of said MOSFET.

* * * * *